United States Patent [19]
Reuss et al.

[11] Patent Number: 5,394,007
[45] Date of Patent: Feb. 28, 1995

[54] ISOLATED WELL AND METHOD OF MAKING

[75] Inventors: Robert H. Reuss, Scottsdale; David J. Monk, Gilbert; Christopher P. Dragon, Tempe, all of Ariz.

[73] Assignee: Motorola, Inc., Schaumburg, Ill.

[21] Appl. No.: 119,636

[22] Filed: Sep. 13, 1993

Related U.S. Application Data

[62] Division of Ser. No. 964,700, Oct. 22, 1992, Pat. No. 5,268,312.

[51] Int. Cl.$^6$ .................... H01L 27/02; H01L 27/04; H01L 27/2

[52] U.S. Cl. ................................. 257/544; 257/548; 257/549; 437/77

[58] Field of Search ........ 257/371, 373, 376, 544–556, 257/369; 437/27–29, 74–77

[56] References Cited

U.S. PATENT DOCUMENTS 3,502,951 3/1970 Hunts ............................... 257/555
5,162,252 11/1992 Kanda et al. .................... 257/554

FOREIGN PATENT DOCUMENTS 59-55053 3/1984 Japan ................................ 257/544

Primary Examiner—J. Carroll
Attorney, Agent, or Firm—Miriam Jackson

[57] ABSTRACT

A junction isolated P-well is formed for high performance BiCMOS. Two dopants of opposite conductivity types are implanted and co-diffused inside an annular N-type region to form a narrow N-type buried layer positioned between two P-type regions. N-type buried layer is formed having P-type doped regions above and below the N-type buried layer so that the N-type buried layer is narrow. The P-type region above the N-type buried layer provides for a retrograde profile of the P-well formed above it. Besides the P-well isolation, the P-type region below the N-type buried layer acts as a ground plane which collects noise, which helps to prevent it from being coupled to other devices of the BiCMOS circuit.

7 Claims, 2 Drawing Sheets

ISOLATED WELL AND METHOD OF MAKING

This is a division of application Ser. No. 07/964,700, filed Oct. 22, 1992, U.S. Pat. No. 5,268,322.

BACKGROUND OF THE INVENTION

This invention relates, in general, to semiconductor devices, and more particularly, but not limited to, a method of forming isolated P-type wells in the fabrication of BiCMOS structures.

A BiCMOS circuit integrates complementary MOS transistors, as well as complementary bipolar transistors. With the integration of more and more multiple functions onto a single chip, signal isolation between devices has been reduced. Particularly when both analog and digital devices are integrated onto the same chip, crosstalk can be a major problem. In the past, only the N-type well of the NPN and PMOS is typically isolated from the substrate. Thus, crosstalk can occur because the NMOS and vertical PNP transistors are fabricated in a common substrate. This common substrate prevents independent biasing of the NMOS back-gate and the vertical PNP collector and allows for noise coupling between transistors, which is undesirable.

Thus, a need has arisen for a method of improving signal isolation by isolating the P-type wells as well as the N-type wells from the substrate. This method should be compatible with existing BiCMOS technology and applicable to high performance devices. The isolation of the P-type well would also allow for separate back gate bias for NMOS devices, as well as isolation of the memory cells for SRAMs.

In the past, a standard N+ buried layer has been used. The use of this standard N+ buried layer requires the use of a thick epitaxial layer in which the active device is fabricated and thus, is only adequate for low performance BiCMOS technology (having an NPN transistor with a maximum frequency less than 3 gigahertz and a gate delay of greater than or equal to 500 picoseconds). High performance BiCMOS requires the use of a thin epitaxial layer. A standard N+ buried layer cannot be used for isolated NMOS or PNP fabricated in a thin epitaxial layer because the N+ buried layer would come too close to the source/drain of the device fabricated in the P-type well. If the N+ buried layer is too close to the active junctions of the device, punch-through and leakage preclude useful circuit operation.

Another method which has been used to isolate P-type wells is an N− buried layer (or well). However, the use of an N− buried layer is not adequate for forming high density BiCMOS circuits, because the long heat cycle necessary to diffuse the N− buried layer deep into the substrate results in excessive lateral diffusion and low device packing density. In addition, extra processing is required to align the N− buried layer to the N+ buried layer 11' (used in the PMOS and NPN), thus increasing process complexity and lowering yield.

Thus, there is a need to form isolated P-wells for the fabrication of high performance BiCMOS while minimizing process complexity and cost.

SUMMARY OF THE INVENTION

An isolated well is formed by providing a semiconductor material of a first conductivity type and forming a doped annular region of a second conductivity type in the semiconductor material. A dopant of the first conductivity type and a dopant of the second conductivity type are introduced into the semiconductor material inside the doped annular region. A semiconductor layer is formed on the semiconductor material. An annular isolation region of the second conductivity is formed in the semiconductor layer and above the doped annular region. The semiconductor material is annealed to diffuse the dopants of the first and the second conductivity type to form a first doped region of the first conductivity type inside the doped annular region and a second doped region of the second conductivity type inside the doped annular region and a third doped region of the first conductivity type, wherein the second doped region is positioned between the first doped region and the third doped region, and the third doped region is positioned above the second doped region. The first doped region and the third doped region are more heavily doped than the semiconductor material. A fourth doped region of the first conductivity type is formed in the semiconductor layer above the third doped region, wherein the third doped region is more heavily doped than the fourth doped region.

DETAILED DESCRIPTION OF THE DRAWINGS

Figure 1:
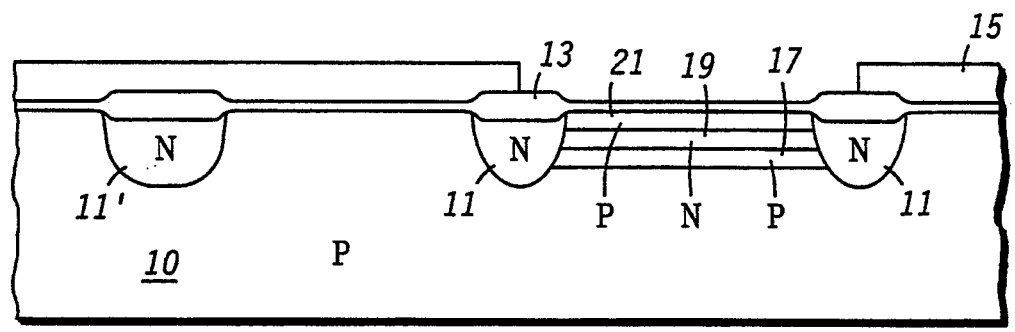
FIG. 1 illustrates an enlarged, cross-sectional view of an embodiment of the present invention in a beginning stage of fabrication.

FIG. 1 illustrates an enlarged, cross-sectional view of an embodiment of the present invention in a beginning stage of fabrication. What is shown is a semiconductor material 10 of a first conductivity type. In a preferred embodiment, semiconductor material 10 is comprised of a P-type silicon substrate having a dopant concentration of approximately $1 \times 10^{15}$ atoms/cm$^3$. A doped annular region 11 of a second conductivity type is formed in semiconductor material 10, extending from the surface of semiconductor material 10. At the same time doped annular region 11 is formed a doped region 11' of the second conductivity type may also be formed to provide a buried layer for other devices, e.g., an NPN or PMOS transistor, to be fabricated. Doped annular region 11 is formed to have a peak concentration of approximately $1 \times 10^{19}$ to $8 \times 10^{19}$ atoms/cm$^3$. This region can be formed by ion implantation of arsenic into semiconductor material 10 using an energy of approximately 40 to 60 KeV and a dose of approximately $5 \times 10^{15}$ to $1.5 \times 10^{16}$ atoms/cm$^2$.

Next, an oxidation step is performed to form oxide layer 13 on the surface of semiconductor material 10. Note that oxide layer 13 is thickest over doped annular region 11 and doped region 11' because of the heavy doping in those regions. Next, a masking layer 15 is formed on oxide layer 13 and patterned to provide an opening overlying doped annular region 11. The thick portion of oxide layer 13 is used for the alignment of the opening of masking layer 15 over doped annular region 11.

Thereafter, an N-type dopant and a P-type dopant are introduced, preferably by ion implantation, in semiconductor material 10 inside doped annular region 11. A solid state diffusion process may be used instead of ion implantation. The two dopants are co-diffused at the same time to form a first doped region 17 of the first conductivity type, a second doped region 19 of the second conductivity type, and a third doped region 21 of the first conductivity type. Third doped region 21 is actually formed after semiconductor material 10 has been subjected to the heat cycles used in the formation of a semiconductor layer 30 and the formation of a well 35 (shown in FIG. 2), but third doped region 21 is shown in FIG. 1 to facilitate the description of the invention.

Preferably, the first co-diffusion heat cycle of the two dopants is carried out by annealing semiconductor material 10 at a temperature of approximately 1200° C. for approximately 5 min. The two dopants are chosen so that the diffusivities and interaction between them form second doped region 19 positioned between first doped region 17 and third doped region 21, with third doped region 21 positioned above second doped region 19. The P-type dopant is chosen so that it forms first doped region 17 and third doped region 21 which is at least more heavily doped than semiconductor material 10, and more preferably with sufficient doping to optimize device performance.

In a preferred embodiment, the N-type dopant is either arsenic or antimony and implanted at an energy of approximately 100 to 200 KeV and a dose of approximately $5 \times 10^{13}$ to $5 \times 10^{14}$ atoms/cm$^2$, which results in forming second doped region 19 having a peak dopant concentration of approximately $10^{17}$ to $10^{18}$ atoms/cm$^3$.

The P-type dopant is preferably comprised of boron, implanted at approximately 30 to 100 KeV at approximately $1 \times 10^{13}$ to $3 \times 10^{14}$ atoms/cm$^2$, which results in forming first doped region 17 and third doped region 21 having a peak dopant concentration of approximately $5 \times 10^{16}$ to $5 \times 10^{18}$ atoms/cm$^3$. The present invention takes advantage of the different diffusivities and interaction of the two dopants so that only one masking layer is needed to achieve the dopant profile of the present invention.

Figure 2:
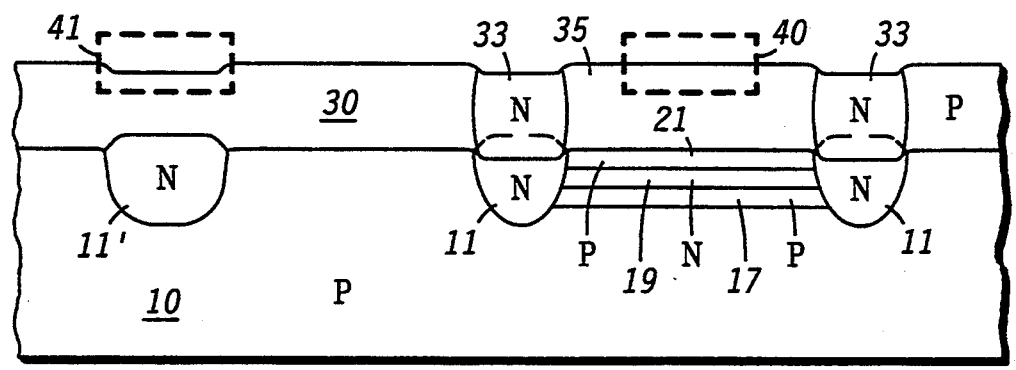
FIG. 2 illustrates an enlarged, cross-sectional view of an embodiment of the present invention in a further stage of fabrication.

FIG. 2 illustrates an enlarged, cross-sectional view of the structure of FIG. 1 further along in processing. First, masking layer 15 is removed. Then, oxide layer 13 is removed from the surface of semiconductor material 10. Subsequently, a semiconductor layer 30 is formed on the surface of semiconductor material 10. In a preferred embodiment, semiconductor layer 30 is comprised of a lightly doped epitaxial layer of either the first or the second conductivity type. An epitaxial layer having a dopant concentration of less than approximately $5 \times 10^{15}$ atoms/cm$^3$ and having a thickness of 1 to 2 microns is preferred. The thickness of semiconductor layer 30 is critical for fabricating high performance BiCMOS, in particular to minimize the collector resistance and capacitance and enhance the performance of an NPN transistor fabricated in semiconductor layer 30.

Then, an isolation region 33, an annular region having a shape similar to the shape of doped annular region 11, of the second conductivity is formed in semiconductor layer 30 and above doped annular region 11 to form an isolated region 35. In a preferred embodiment, isolation region 33 is formed by ion implanting phosphorus at an energy of approximately 180 KeV and a dose of approximately $1 \times 10^{12}$ to $6 \times 10^{12}$ atoms/cm$^2$. Typically, a field oxide layer (not shown) is also formed over isolation region 33 to provide further isolation.

Figure 3:
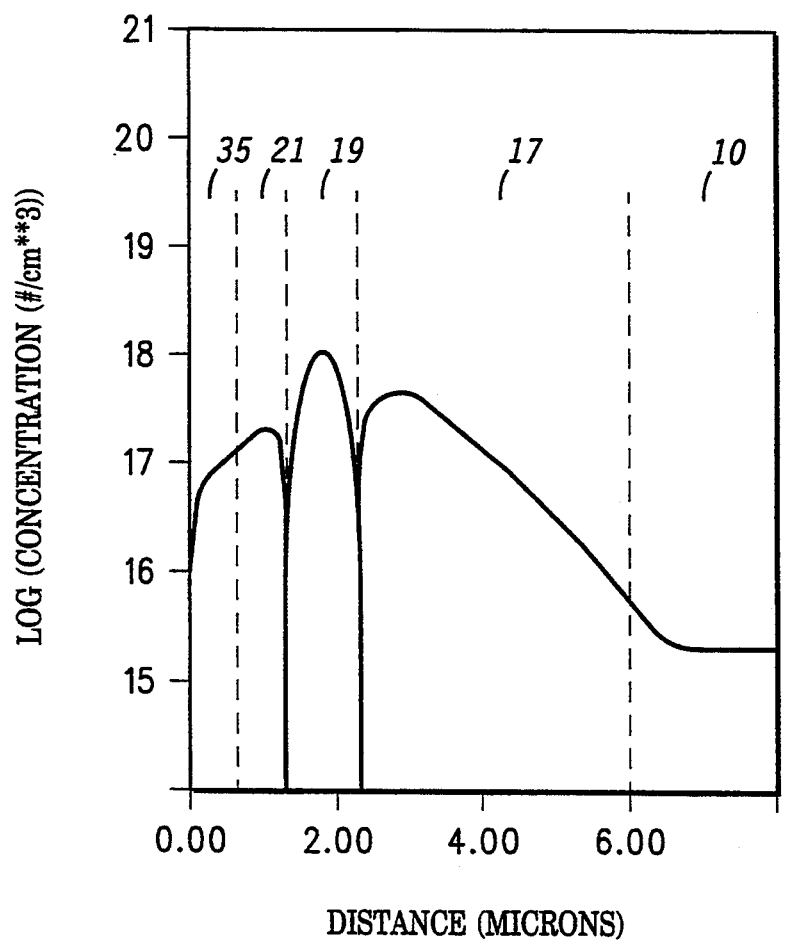
FIG. 3 illustrates a graphical representation of the depth versus concentration of an embodiment of the semiconductor layers formed in the present invention.

Note that second doped region 19, along with doped annular region 11 and isolation region 33 together result in isolating well 35. In a preferred embodiment, well 35 can be formed by merely using a P-type semiconductor layer 30. However, well 35 can also be formed by appropriately doping semiconductor layer 30 P-type if an N-type epitaxial layer is formed for semiconductor layer 30. In a preferred embodiment, a P-type semiconductor layer 30 is used and additional P-type doping is provided to provide well 35 having a peak concentration of approximately $5 \times 10^{15}$ to $5 \times 10^{17}$ atoms/cm$^3$ to enhance the device characteristics of the semiconductor device formed in well 35. The diffusion of well 35 (typically 1080° C. for 90 min.), along with the diffusion just after implantation of the two dopants, and the formation of semiconductor layer 30, provides sufficient time at a sufficient temperature to form the profiles of doped regions 17, 19, and 21. An example of these profiles is shown in FIG. 3. After the above processing, doped annular region 11 and doped region 11' partially diffuse up into semiconductor layer 30 (as shown in FIG. 2) and third doped region 21 partially diffuses up into well 35 (as shown in FIG. 3).

Semiconductor devices, shown by dotted box 40 and 41 may then be formed in semiconductor layer 30. For example, a vertical PNP bipolar transistor can be formed in box 40 which is isolated from semiconductor material 10. High performance BiCMOS devices may be fabricated using the present invention, because a thin semiconductor layer 30 may be used and doped region 19 may be moderately doped. Isolated NMOS devices may also be fabricated in box 40. Well 35, along with third doped region 21, serves as a deep collector for a PNP bipolar transistor to be fabricated in P-type well 35.

It may be desirable to fabricate BiCMOS circuits having isolated wells 35, as well as non-isolated wells. Proper selection of dopant levels of doped regions 17, 19, and 21 allows the formation of isolated and non-isolated devices having substantially the same electrical characteristics.

FIG. 3 illustrates an example of the dopant profiles of the doped regions/semiconductor layers formed in an embodiment of the present invention. FIG. 3 is a graphical representation generated by computer simulations and verified by spreading resistance profile measurements on a fabricated embodiment of the present invention. Note that second doped region 19 is narrow, relatively heavily doped, and far away, approximately 1.25 microns, from the active device surface, which minimizes punch-through and leakage problems from the N+ junction of semiconductor device 40 that would be present if solely an N+ buried layer is used with semiconductor layer 30 having a thickness of approximately 1–2 microns. If the peak concentration of second doped region 19 is too low, well 35 to semiconductor material 10 punch-through would not be prevented. The doping of second doped region 19 is sufficiently high that the breakdown voltage from well 35 to semiconductor material 10 is greater than 15 volts. If the peak concentration is too high, second doped region 19 will diffuse up too far, resulting in punch-through voltage from the junctions of device 40 being too low.

Note also that well 35 is not heavily doped at the surface so good NMOS characteristics can be obtained. Dopant region 21, along with well 35, form a retrograde profile (the heavily doped portion is at the bottom of well 35), which results in low collector resistance for a PNP transistor (semiconductor device 40) and maximizes punch through voltage from N+ regions of the PNP or NMOS devices (semiconductor device 40) to second doped region 19. If the peak concentration of third doped region 21 is too low, the punch through voltage would be too low, and the collector resistance of the PNP transistor (semiconductor device 40) fabricated in well 35 would be too high. If the peak concentration of third doped region 21 is too high, up diffusion of third doped region 21 toward the surface of well 35 could change the electrical characteristics of the device formed in well 35 and the capacitance from third doped region 21 to second doped region 19 and doped annular region 11 would increase and thereby degrade performance. Additionally, first doped region 17 acts as a ground plane which collects noise, thus preventing the noise from being coupled to other devices of the BiCMOS circuit.

As can be readily seen, high performance BiCMOS devices, having isolated P-wells as well as N-wells, can be fabricated utilizing the present invention. NMOS or vertical PNP transistors may be fabricated in isolated P-wells to eliminate or reduce crosstalk between each transistor. This can be done by only using one additional masking layer over a process not having isolated P-wells. In addition, the isolated P-well of the present invention has a small footprint, unlike that of a P-well isolated by a large N− type region, and can thus be easily integrated into BiCMOS circuits.

We claim:
1. An isolated well, comprising:
a semiconductor material of a first conductivity type;
a doped annular region of a second conductivity type formed in the semiconductor material;
a first doped region of the first conductivity type positioned inside the doped annular region, a second doped region of the second conductivity type positioned inside the doped annular region, and a third doped region of the first conductivity type positioned inside the doped annular region, wherein the second doped region is positioned between the first doped region and the third doped region, the third doped region is positioned above the second doped region, and the first doped region and is more heavily doped than the semiconductor material;
a semiconductor layer on the semiconductor material;
an annular isolation region of the second conductivity formed in the semiconductor layer and above the doped annular region; and
a fourth doped region of the first conductivity type formed in the semiconductor layer above the third doped region and extending from the annular isolation region, from a surface of the semiconductor layer and down into a portion of the semiconductor layer, wherein the third doped region is more heavily doped than the fourth doped region.

2. The isolated well of claim 1 wherein the dopant of the first conductivity type of the first doped region and the third doped region is comprised of boron.

3. The isolated well of claim 1 wherein the dopant of the second conductivity type of the second doped region is comprised of arsenic.

4. The isolated well of claim 1 wherein the step of the semiconductor layer is comprised of a semiconductor layer having a thickness of approximately 1 to 2 microns.

5. The isolated well of claim 1 wherein the second doped region has a peak concentration of approximately $10^{17}$ to $10^{18}$ atoms/cm$^3$.

6. The isolated well of claim 1 wherein the first and the third doped regions have a peak concentration of approximately $5 \times 10^{16}$ to $5 \times 10^{18}$ atoms/cm$^3$.

7. The isolated well of claim 1 wherein the third doped region and the fourth doped region form a retrograde doping profile of the first conductivity type.

* * * * *